(12) United States Patent
Nishizawa et al.

(10) Patent No.: US 11,264,950 B2
(45) Date of Patent: Mar. 1, 2022

(54) VIBRATION ELEMENT AND OSCILLATOR

(71) Applicant: Seiko Epson Corporation, Toyko (JP)

(72) Inventors: Ryuta Nishizawa, Nagano (JP);
Atsushi Matsuo, Shiojiri (JP); Keiichi Yamaguchi, Ina (JP); Byonhaku Yu, Minowa (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 17/325,354

(22) Filed: May 20, 2021

(65) Prior Publication Data

US 2021/0273609 A1    Sep. 2, 2021

Related U.S. Application Data

(63) Continuation of application No. 17/072,124, filed on Oct. 16, 2020, now Pat. No. 11,070,169.

(30) Foreign Application Priority Data

Oct. 18, 2019 (JP) .............................. JP2019-190899

(51) Int. Cl.
*H03B 5/32* (2006.01)
*H03B 5/04* (2006.01)
*H03H 9/02* (2006.01)
*H03H 3/04* (2006.01)
*G01K 7/32* (2006.01)

(52) U.S. Cl.
CPC ................. *H03B 5/32* (2013.01); *G01K 7/32* (2013.01); *H03B 5/04* (2013.01); *H03H 3/04* (2013.01); *H03H 9/02023* (2013.01); *H03H 9/02055* (2013.01); *H03H 9/02102* (2013.01); *H03H 9/02133* (2013.01); *H03H 2003/0407* (2013.01); *H03H 2003/0435* (2013.01)

(58) Field of Classification Search
CPC ... H03B 5/32; H03B 5/04; G01K 7/32; H03H 9/02133; H03H 9/02055; H03H 9/02102; H03H 9/02023; H03H 2003/0435; H03H 2003/0407; H03H 3/04
USPC .... 331/116 M, 156, 176, 154; 310/370, 318, 310/365
See application file for complete search history.

(56) References Cited

U.S. PATENT DOCUMENTS 5,214,668 A     5/1993   Satou et al.
2013/0027141 A1  1/2013   Koyama et al.
2014/0292435 A1* 10/2014  Yamada ............... H03H 9/1021
                                              331/158

(Continued)

FOREIGN PATENT DOCUMENTS

JP    H04-363913 A    12/1992
JP    2013-098841 A    5/2013

*Primary Examiner* — Arnold M Kinkead
(74) *Attorney, Agent, or Firm* — Harness, Dickey & Pierce, P.L.C.

(57) ABSTRACT

A vibration element includes: a quartz crystal substrate having a first vibration part and a second vibration part; a pair of first excitation electrodes formed at two main surfaces of the quartz crystal substrate, at the first vibration part; and a pair of second excitation electrodes formed in such a way as to sandwich the second vibration part in a direction of thickness of the quartz crystal substrate, at the (Continued)

second vibration part. At least one second excitation electrode of the pair of second excitation electrodes is formed at an inclined surface inclined to at least one of the two main surfaces.

10 Claims, 15 Drawing Sheets

(56) References Cited

U.S. PATENT DOCUMENTS

2016/0226444 A1　8/2016　Yamashita

* cited by examiner

VIBRATION ELEMENT AND OSCILLATOR

This is a continuation patent application of U.S. application Ser. No. 17/072,124, filed Oct. 16, 2020, which is based on, and claims priority from JP Application Serial Number 2019-190899, filed Oct. 18, 2019, the disclosures of which are hereby expressly incorporated by reference herein in their entireties.

BACKGROUND

1. Technical Field

The present disclosure relates to a vibration element and an oscillator.

2. Related Art

A quartz crystal vibrator having an excitation electrode formed at two main surfaces of a quartz crystal substrate has stable frequency-temperature characteristics and therefore is used as a reference frequency source which outputs a frequency signal for an oscillator such as a temperature compensated crystal oscillator (TCXO). The TCXO has a temperature compensation circuit using a temperature sensor and provides a stable frequency signal over a broad temperature range. However, in the quartz crystal vibrator, the quartz crystal substrate is accommodated in a package. Therefore, a heat transfer time difference is generated between the quartz crystal substrate and the temperature sensor and a difference is generated between the temperature measured by the temperature sensor and the temperature of the quartz crystal substrate, thus posing a problem in that the accuracy of temperature compensation drops.

Thus, for example, JP-A-2013-98841 discloses a configuration where a first vibration part for oscillation signal output and a second vibration part for temperature detection are provided at a common piezoelectric plate, that is, two vibrators for oscillation signal output and for temperature detection are formed at the one piezoelectric plate, thus eliminating the heat transfer time difference between the two vibrators and accurately measuring the temperature of the vibrator for oscillation signal output.

However, in JP-A-2013-98841, since an excitation electrode for oscillation signal output and an excitation electrode for temperature detection are formed at the same main surface having the same cutting angle, the vibrator for oscillation signal output and the vibrator for temperature detection have similar frequency-temperature characteristics. The vibrator for oscillation signal is set at such a cutting angle as to have small frequency change to temperature change. Therefore, the vibrator for temperature detection similarly has small frequency change to temperature change. This poses a problem in that, due to a low resolution of temperature change to frequency change, the temperature of the vibrator for oscillation signal output cannot be accurately detected.

SUMMARY

A vibration element includes: a quartz crystal substrate having a first vibration part and a second vibration part; a pair of first excitation electrodes formed at two main surfaces of the quartz crystal substrate, at the first vibration part; and a pair of second excitation electrodes formed in such a way as to sandwich the second vibration part in a direction of thickness of the quartz crystal substrate, at the second vibration part. At least one second excitation electrode of the pair of second excitation electrodes is formed at an inclined surface inclined to the two main surfaces.

In the vibration element, the two main surfaces and the inclined surface may have different cutting angles from each other.

In the vibration element, the first vibration part and the second vibration part may have different frequency-temperature characteristics from each other.

In the vibration element, the frequency-temperature characteristics of the second vibration part may include a greater amount of frequency change than the frequency-temperature characteristics of the first vibration part.

In the vibration element, the inclined surface may be inclined in such a way that the second vibration part has a thickness reduced as it goes away from the first vibration part.

In the vibration element, the inclined surface may be inclined in such a way that the second vibration part has a thickness reduced as it goes toward the first vibration part.

In the vibration element, the first vibration part may have a protrusion formed at least at one of the two main surfaces.

The vibration element may have a fixing part fixing the vibration element to a package and may have at least one of a through-hole and a narrow part between the first vibration part and the second vibration part, and the fixing part.

The vibration element may have at least one of a through-hole and a thin part between the first vibration part and the second vibration part.

An oscillator includes: the foregoing vibration element; a first oscillation circuit electrically coupled to the first excitation electrodes and outputting a first oscillation signal; a second oscillation circuit electrically coupled to the second excitation electrodes and outputting a second oscillation signal; and a control signal output circuit outputting a control signal controlling an oscillation frequency of the first oscillation signal, based on the second oscillation signal.

DESCRIPTION OF EXEMPLARY EMBODIMENTS

1. First Embodiment

First, a vibration element 1 according to a first embodiment will be described with reference to FIGS. 1 and 2.

Figure 1:
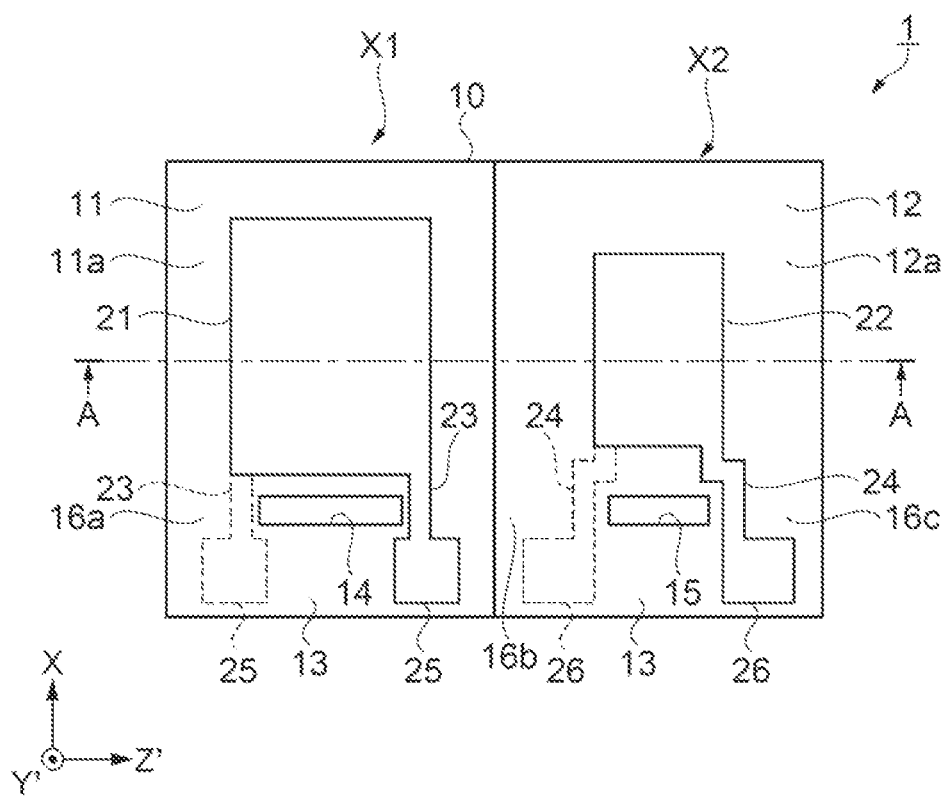
FIG. 1 is a plan view showing a schematic configuration of a vibration element according to a first embodiment.
Figure 2:
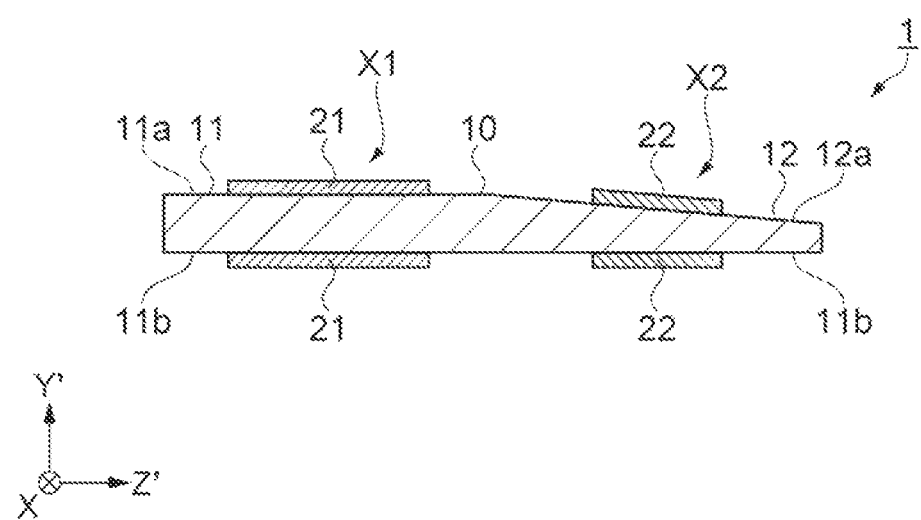
FIG. 2 is a cross-sectional view taken along A-A in FIG. 1.

FIG. 1 is a plan view showing a schematic configuration of the vibration element 1 according to the first embodiment. FIG. 2 is a cross-sectional view taken along A-A in FIG. 1. An X-axis, a Y'-axis, and a Z'-axis in the illustrations are crystal axes of quartz crystal that are orthogonal to each other. The Y'-axis and the Z'-axis are a Y-axis and a Z-axis rotated about the X-axis. A direction along the X-axis is referred to as an "X-direction". A direction along the Y'-axis is referred to as a "Y'-direction". A direction along the Z'-axis is referred to as a "Z'-direction". The direction indicated by an arrow is a positive side. The position side of the Y'-direction is referred to as "up" or "above". The negative side of the Y'-direction is referred to as "down" or "below".

The vibration element 1 according to this embodiment has a quartz crystal substrate 10, a first excitation electrode 21 formed at a first vibration part 11, a second excitation electrode 22 formed at a second vibration part 12, terminals 25, 26 formed at a fixing part 13, and lead electrodes 23, 24 electrically coupling the first excitation electrode 21 and the terminal 25 together and electrically coupling the second excitation electrode 22 and the terminal 26 together, respectively.

In the vibration element 1, the first vibration part 11, where a pair of first excitation electrodes 21 are formed, forms a first vibration element X1, and the second vibration part 12, where a pair of second excitation electrodes 22 are formed, forms a second vibration element X2. The first vibration element X1 and the second vibration element X2 are coupled together.

The quartz crystal substrate 10 is a flat plate having a main surface on an XZ' plane and having a thickness in the Y'-direction. The quartz crystal substrate 10 has the first vibration part 11, where the first excitation electrode 21 is formed, the second vibration part 12, where the second excitation electrode 22 is formed, and the fixing part 13 fixing the quartz crystal substrate 10 to inside a package, not illustrated, or the like.

Between the first vibration part 11 and the second vibration part 12, and the fixing part 13, a first through-hole 14, a second through-hole 15, and narrow parts 16a, 16b, 16c are provided. Therefore, transmission of a stress from the fixing part 13 to the first vibration part 11 and the second vibration part 12 due to loading into the package can be reduced. The narrow parts are parts having a shorter length in the Z'-direction than the length of the quartz crystal substrate 10 in the Z'-direction.

The first vibration part 11 has a first main surface 11a and a second main surface 11b parallel to each other. At the first main surface 11a and the second main surface 11b, the pair of first excitation electrodes 21 are formed, overlapping each other as viewed in a plan view. In this embodiment, the first main surface 11a and the second main surface 11b are equivalent to two main surfaces.

The second vibration part 12 has an inclined surface 12a inclined to the first main surface 11a. At the inclined surface 12a and the second main surface 11b, the pair of second excitation electrodes 22 are formed, overlapping each other as viewed in a plan view. The inclined surface 12a of the second vibration part 12 is inclined in such a way that the thickness of the second vibration part 12 is reduced as it goes away from the first vibration part 11.

At the first main surface 11a of the first vibration part 11, the first excitation electrode 21, the terminal 25 for electrically coupling to an oscillation circuit, not illustrated, and the lead electrode 23 electrically coupling the first excitation electrode 21 and the terminal 25 together, are formed.

At the second main surface 11b of the first vibration part 11, the first excitation electrode 21, the terminal 25, and the lead terminal 23 electrically coupling the first excitation electrode 21 and the terminal 25 together, are formed.

At the inclined surface 12a of the second vibration part 12, the second excitation electrode 22, the terminal 26, and the lead electrode 24 electrically coupling the second excitation electrode 22 and the terminal 26 together, are formed.

At the second main surface 11b of the second vibration part 12, the second excitation electrode 22, the terminal 26, and the lead electrode 24 electrically coupling the second excitation electrode 22 and the terminal 26 together, are formed.

In the first vibration element X1, the pair of first excitation electrodes 21 are formed at the first main surface 11a and the second main surface 11b of the first vibration part 11, and by applying a voltage to the terminal 25, the first vibration part 11 can be resonated.

In the second vibration element X2, the pair of second excitation electrodes 22 are formed in such a way as to sandwich the second vibration part 12 in the direction of the thickness of the quartz crystal substrate 10, that is, the pair of second excitation electrodes 22 are formed at the inclined surface 12a and the second main surface 11b of the second vibration part 12, and by applying a voltage to the terminal 26, the second vibration part 12 can be resonated.

The quartz crystal substrate 10 in this embodiment will now be described in detail with reference to FIGS. 3, 4 and 5.

Figure 3:
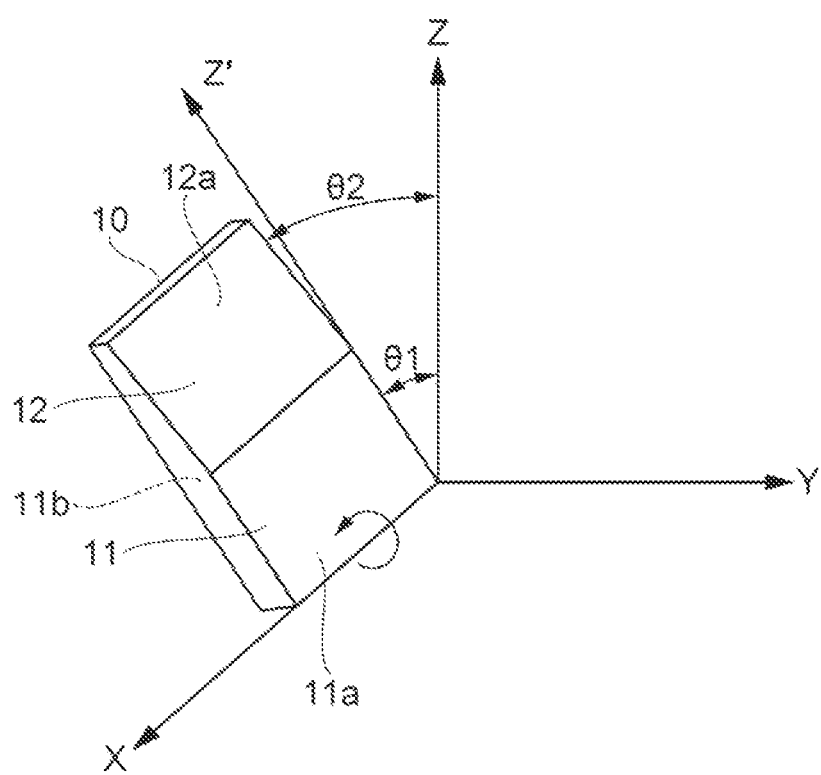
FIG. 3 explains a cutting angle of a quartz crystal substrate.
Figure 4:
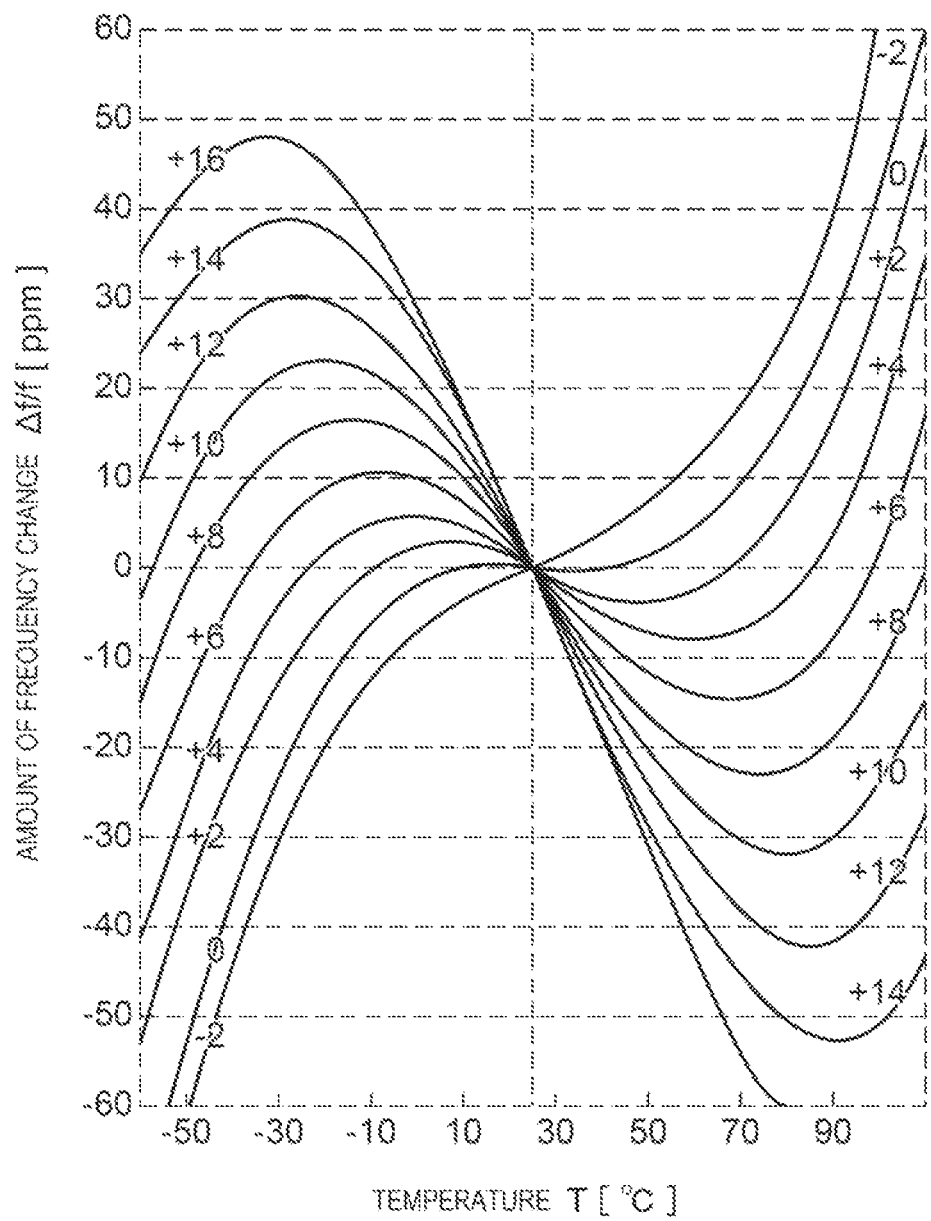
FIG. 4 shows frequency-temperature characteristics to the cutting angle of the quartz crystal substrate.

FIG. 3 explains a cutting angle θ of the quartz crystal substrate 10. FIG. 4 shows frequency-temperature characteristics to the cutting angle θ of the quartz crystal substrate 10. FIG. 5 shows frequency-temperature characteristics of the vibration element 1.

As shown in FIG. 3, the quartz crystal substrate 10 has the crystal axes X, Y, Z orthogonal to each other. The X-axis is referred to as an electrical axis. The Y-axis is referred to as a mechanical axis. The Z-axis is referred to as an optical axis. The quartz crystal substrate 10 is a flat plate sliced along a plane resulting from rotating the XZ plane about the X-axis by a predetermined angle θ, that is, a so-called rotated Y-cut quartz crystal substrate. The angle θ about the X-axis is referred to as a cutting angle θ. The frequency-temperature characteristics of the rotated Y-cut quartz crystal substrate are decided by the cutting angle θ, as shown in FIG. 4. FIG. 4 shows frequency-temperature characteristics to the cutting angle θ at an interval of 2' of the rotated Y-cut quartz crystal substrate. As seen in FIG. 4, a small or large amount of frequency change Δf/f to a change in temperature T can be selected.

When having a cutting angle θ of 35.25° (35° 15'), the rotated Y-cut quartz crystal substrate is referred to an AT-cut quartz crystal substrate and has excellent frequency-temperature characteristics. The AT-cut quartz crystal substrate has the crystal axes X, Y', Z' orthogonal to each other and has a thickness in the Y'-direction and a main surface along a plane including the X-axis and Z'-axis orthogonal to the Y'-axis. Thickness-shear resonance is excited as main resonance on the main surface.

In the quartz crystal substrate 10 in this embodiment, the first main surface 11a of the first vibration part 11 has a cutting angle θ1, and the inclined surface 12a of the second vibration part 12 has a cutting angle θ2. The second main surface 11b is parallel to the first main surface 11a and therefore has the cutting angle θ1. Thus, the first vibration part 11 can have frequency-temperature characteristics corresponding to the cutting angle θ1, and the second vibration part 12 can have frequency-temperature characteristics corresponding to an intermediate angle (θ1+θ2)/2 between the cutting angle θ2 of the inclined surface 12a and the cutting angle θ1 of the second main surface 11b. On the assumption that the cutting angle θ1 of the first vibration part 11 is 35.25° (35° 15'), the frequency-temperature characteristics of the second vibration part 12 include a greater amount of frequency change Δf/f than the frequency-temperature characteristics of the first vibration part 11.

Figure 5:
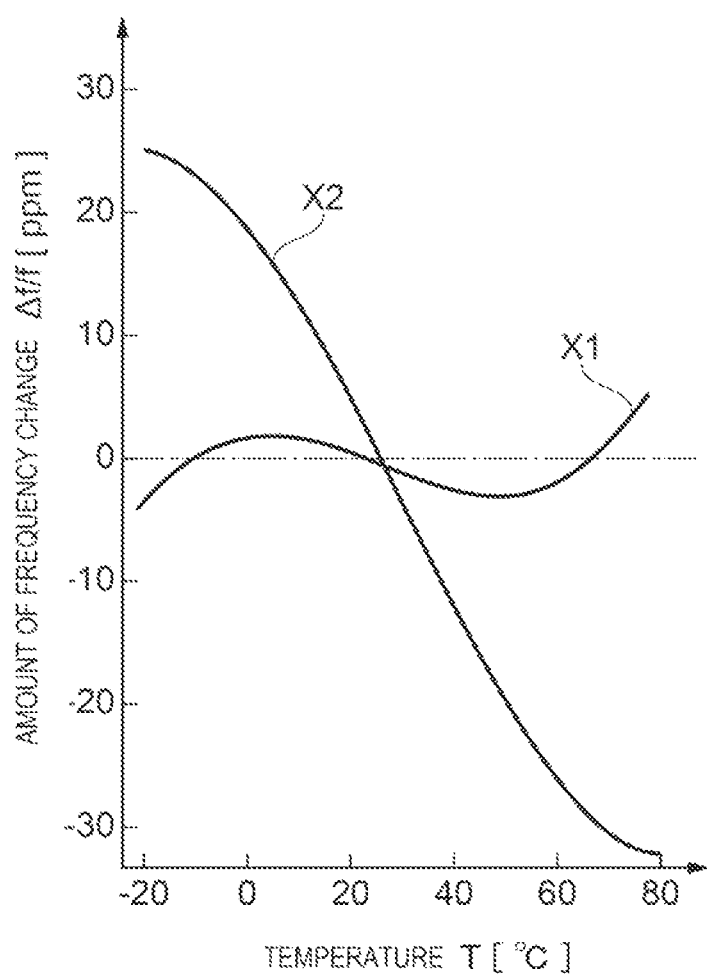
FIG. 5 shows frequency-temperature characteristics of the vibration element.

As shown in FIG. 5, the first vibration element X1 including the first vibration part 11 is used as a vibration element for oscillation signal output having frequency-temperature characteristics including a small amount of frequency change Δf/f to temperature change, and the second vibration element X2 including the second vibration part 12 having the inclined surface 12a is used as a vibration element for temperature detection having frequency-temperature characteristics including a large amount of frequency change Δf/f to temperature change. Thus, the temperature T of the first vibration element X1 can be detected accurately. Also, since the first vibration element X1 for oscillation signal output and the second vibration element X2 for temperature detection are formed at the same quartz crystal substrate 10, there is no difference in heat transfer time and therefore the temperature T of the first vibration element X1 can be detected more accurately.

In this embodiment, the inclined surface 12a is provided at one side of the second vibration part 12. However, this is not limiting. An inclined surface may be provided at the other side, too, that is, at the two sides of the second vibration part 12.

In the vibration element 1 according to this embodiment, the second vibration part 12 has the inclined surface 12a inclined to the first main surface 11a. With the second excitation electrode 22 formed thereat, the second vibration part 12 can achieve different frequency-temperature characteristics from those of the first vibration part 11. Therefore, the first vibration part 11 is set to have stable frequency-temperature characteristics as a vibration element for oscillation signal output, and the second vibration part 12 is used as a vibration element for temperature detection having frequency-temperature characteristics including a greater amount of frequency change Δf/f to temperature change than the first vibration part 11. Thus, the temperature T of the first vibration part 11 for oscillation signal output can be detected accurately.

The first main surface 11a and the inclined surface 12a have different cutting angles θ from each other. Therefore, the frequency-temperature characteristics of the second vibration part 12 having the inclined surface 12a with the different cutting angle θ from that of the first main surface 11a can be made different from the frequency-temperature characteristics of the first vibration part 11.

The first vibration part 11 and the second vibration part 12 have different frequency-temperature characteristics from each other. Therefore, the vibration part having frequency-temperature characteristics including a large amount of frequency change Δf/f to the temperature T is used for temperature detection. Thus, the accuracy of temperature detection can be improved.

The inclined surface 12a is inclined in such a way that the thickness of the second vibration part 12 is reduced as it goes away from the first vibration part 11. Therefore, the cutting angle θ of the second vibration part 12 is different from that of the first vibration part 11 and the second vibration part 12 can thus achieve different frequency-temperature characteristics from those of the first vibration part 11.

The frequency-temperature characteristics of the second vibration part 12 include a larger amount of frequency change Δf/f than the frequency-temperature characteristics of the first vibration part 11. Therefore, when the second vibration part 12 is used for temperature detection, the resolution of temperature change to frequency change increases and the temperature T of the first vibration part 11 can be detected accurately.

A method for manufacturing the vibration element 1 according to this embodiment will now be described with reference to FIGS. 6 to 12.

Figure 6:
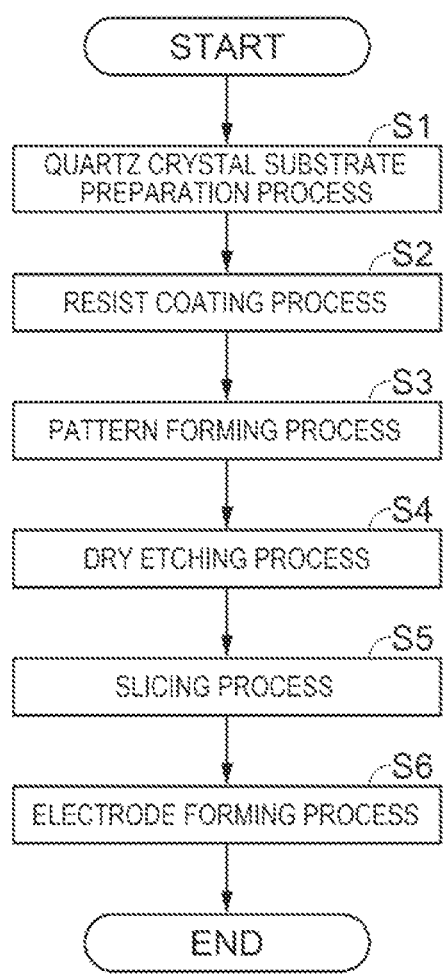
FIG. 6 is a flowchart showing principal processes of manufacturing the vibration element.

FIG. 6 is a flowchart showing principal processes of manufacturing the vibration element 1. FIGS. 7 to 12 are cross-sectional views explaining the processes of manufacturing the vibration element 1.

The method for manufacturing the vibration element 1 includes a quartz crystal substrate preparation process, a resist coating process, a pattern forming process, a dry etching process, a slicing process, and an electrode forming process, as shown in FIG. 6.

1.1 Quartz Crystal Substrate Preparation Process

First, in step S1, a large quartz crystal substrate 80 from which a plurality of vibration elements 1 can be manufactured by a batch-processing method is prepared, considering the mass productivity and manufacturing cost of the vibration element 1. The large quartz crystal substrate is cut out of quartz crystal ore at a predetermined cutting angle θ1, for example, 35.25° (35° 15') and wrapped, polished or similarly processed to have a desired thickness.

1.2 Resist Coating Process

Figure 7:
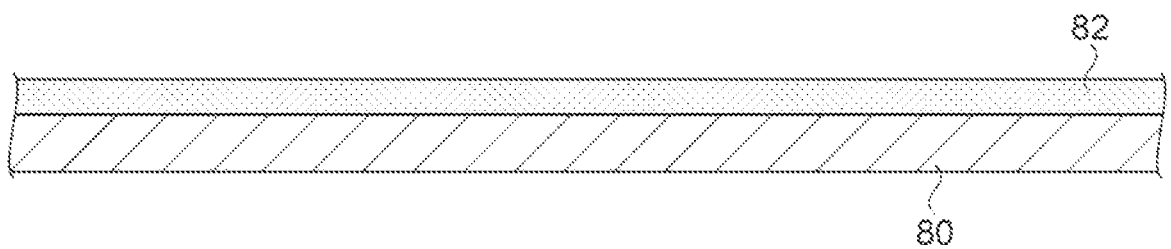
FIG. 7 is a cross-sectional view explaining a process of manufacturing the vibration element.

Next, in step S2, a resist 82 is applied on the large quartz crystal substrate 80, as shown in FIG. 7.

1.3 Pattern Forming Process

Figure 8:
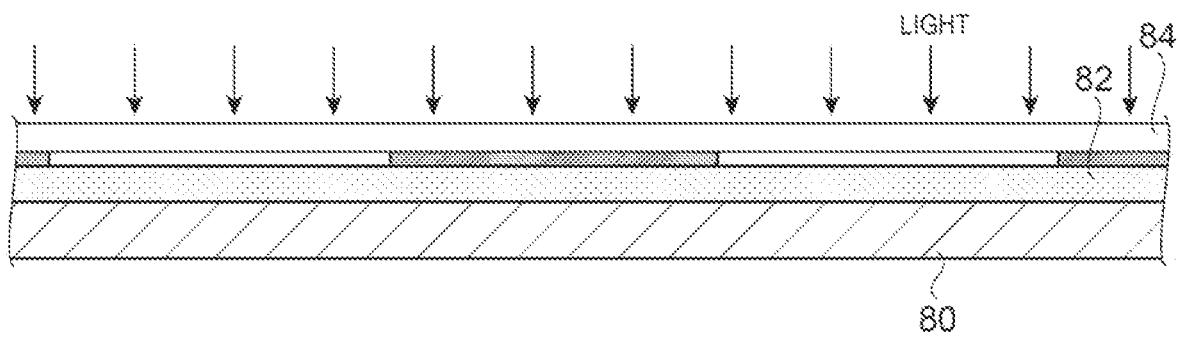
FIG. 8 is a cross-sectional view explaining a process of manufacturing the vibration element.

Next, in step S3, a photomask 84 having an opening in an area where the inclined surface 12a is formed, that is, having an area where a light-shielding film of chromium or the like is not patterned, is arranged on the resist 82, and light is cast using an exposure device or the like, as shown in FIG. 8. At this time, the resist 82 is exposed to light under the condition that the amount of light cast at a part where the thickness of the large quartz crystal substrate 80 is reduced is greater than at a part where the thickness is not reduced, and the resist 82 is then developed. Thus, the resist 82 having a thickness distribution such that the thickness gradually decreases from the thick part toward the thin part, can be formed. This exposure method is referred to as grayscale exposure in which the intensity of exposure is adjusted.

1.4 Dry Etching Process

Figure 9:
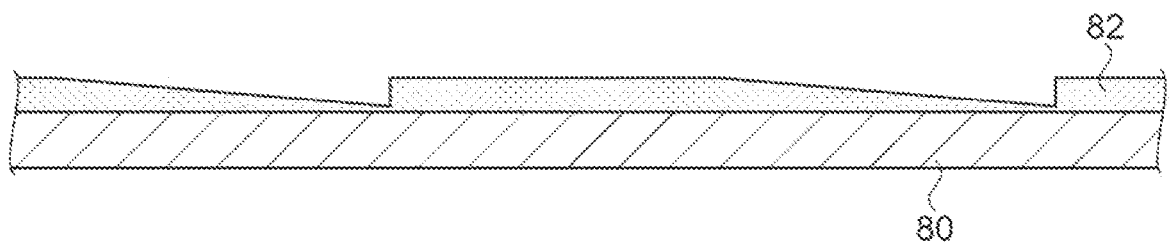
FIG. 9 is a cross-sectional view explaining a process of manufacturing the vibration element.
Figure 10:
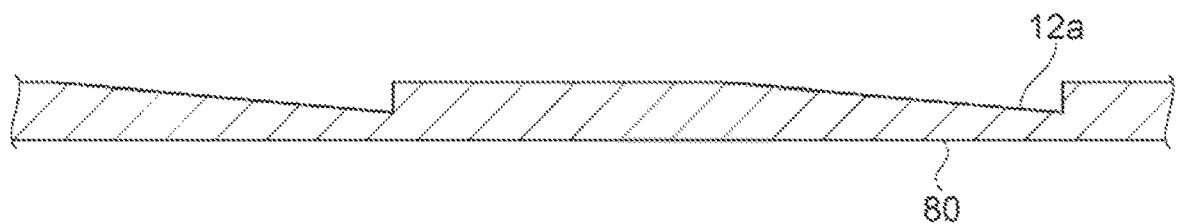
FIG. 10 is a cross-sectional view explaining a process of manufacturing the vibration element.

Next, in step S4, dry etching is performed from above the large quartz crystal substrate 80 so as to remove the resist 82, using a plasma etching device or the like. As shown in FIG. 10, an inclined shape formed in FIG. 9 is transferred to the large quartz crystal substrate 80. The inclined surface 12a is thus formed on the large quartz crystal substrate 80. The inclined surface 12a may be formed by other methods than the above. For example, a metal mold having a recess corresponding to the shape of the inclined surface 12a may be filled with a photosensitive resin. Then, after the photosensitive resin may be transferred to and cured on the large quartz crystal substrate 80, the inclined surface 12a may be formed by dry etching.

1.5 Slicing Process

Figure 11:
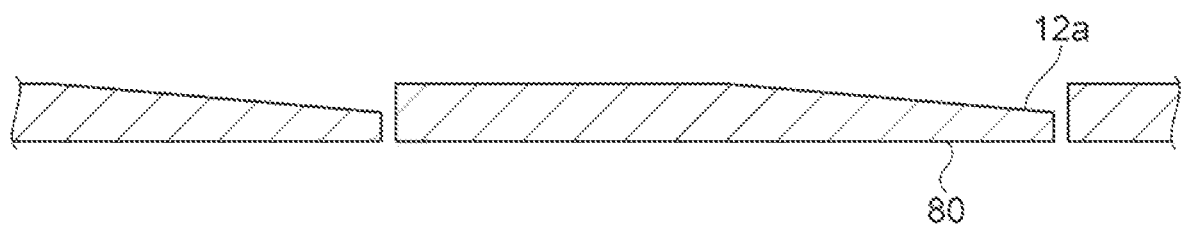
FIG. 11 is a cross-sectional view explaining a process of manufacturing the vibration element.

Next, in step S5, the large quartz crystal substrate 80 having the inclined surface 12a is cut and sliced into an individual quartz crystal substrate, as shown in FIG. 11, for example, using a dicing blade or the like.

1.6 Electrode Forming Process

Figure 12:
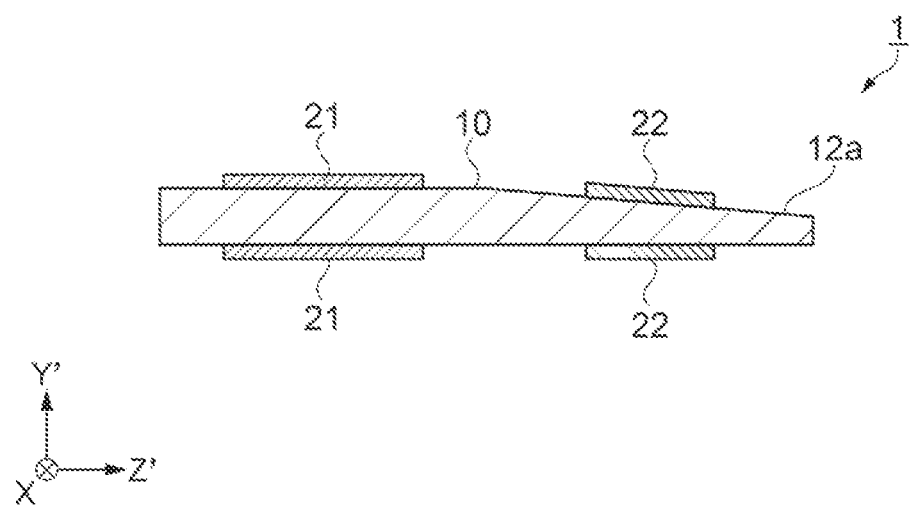
FIG. 12 is a cross-sectional view explaining a process of manufacturing the vibration element.

Next, in step S6, the first excitation electrode 21, the second excitation electrode 22, the lead electrodes 23, 24, and the terminals 25, 26 are formed at the quartz crystal substrate 10 sliced out as an individual quartz crystal substrate, for example, by a sputtering device, vapor deposition device or the like, as shown in FIG. 12. Thus, the vibration element 1 having the inclined surface 12a is provided.

The electrodes may be formed by a photolithography technique before the slicing process.

2. Second Embodiment

A vibration element 1a according to a second embodiment will now be described with reference to FIGS. 13 and 14.

Figure 13:
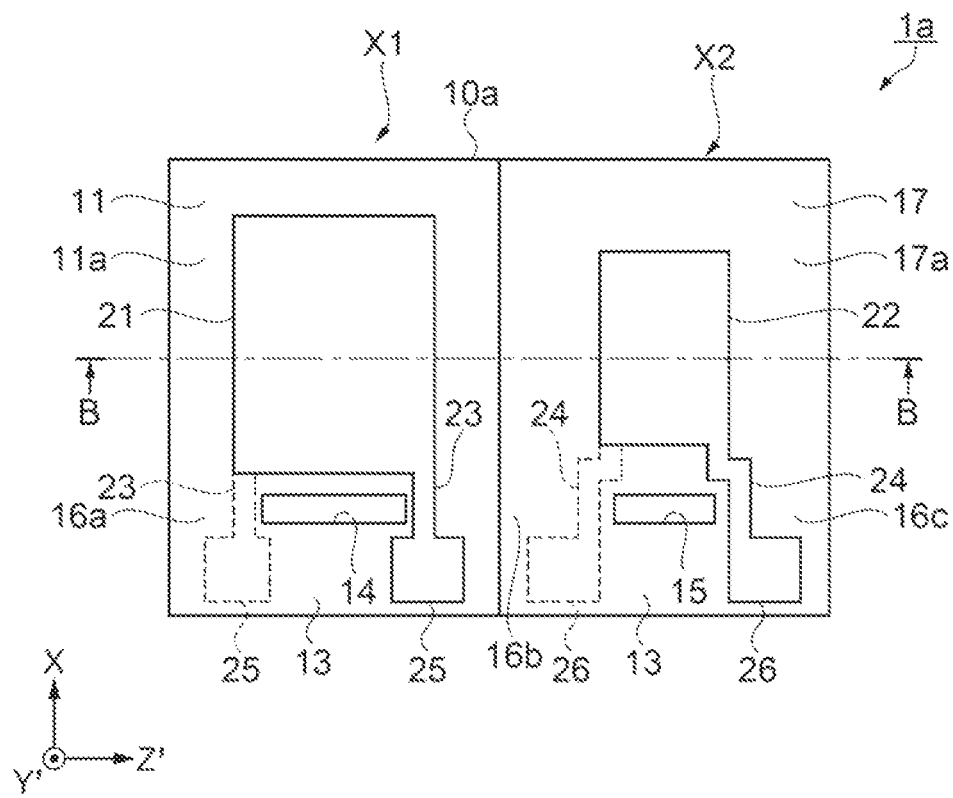
FIG. 13 is a plan view showing a schematic configuration of a vibration element according to a second embodiment.

FIG. 13 is a plan view showing a schematic configuration of the vibration element 1a according to the second embodiment. FIG. 14 is a cross-sectional view taken along B-B in FIG. 13.

The vibration element 1a according to this embodiment is similar to the vibration element 1 according to the first embodiment except that the shape of an inclined surface 17a provided on a second vibration part 17 is different shape from the shape of the inclined surface in the vibration element 1 according to the first embodiment. The difference from the first embodiment will now be described mainly. Similar matters will not be described further.

Figure 14:
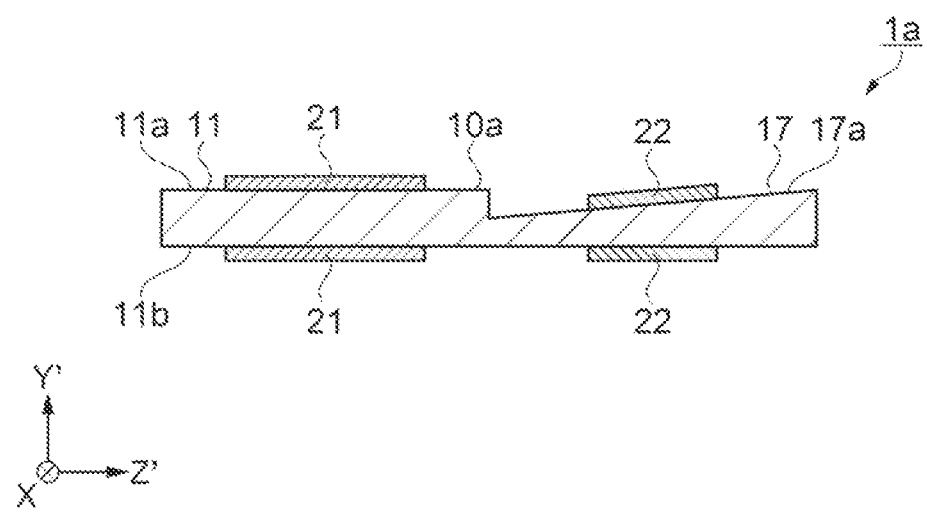
FIG. 14 is a cross-sectional view taken along B-B in FIG. 13.

In the vibration element 1a, the inclined surface 17a provided on the second vibration part 17 of a quartz crystal substrate 10a is inclined in such a way that the thickness of the second vibration part 17 is reduced as it goes toward the first vibration part 11, as shown in FIGS. 13 and 14.

Such a configuration enables the second vibration part 17 to have a different cutting angle θ from the first vibration part 11 and thus have different frequency-temperature characteristics from the first vibration part 11. Therefore, the first vibration part 11 is set to have stable frequency-temperature characteristics as a vibration part for oscillation signal output, and the second vibration part 17 is used as a vibration part for temperature detection having frequency-temperature characteristics including a greater amount of frequency change Δf/f to temperature change than the first vibration part 11. Thus, temperature T of the first vibration part 11 for oscillation signal output can be detected accurately. Also, since a step is formed between the first main surface 11a of the first vibration part 11 and the inclined surface 17a of the second vibration part 17, the resonance energy of the first vibration part 11 can be trapped inside the first vibration part 11 and resonance leakage from the first vibration part 11 to the second vibration part 17 can be reduced. Moreover, a substantial resonance area of the second vibration part 17 can be spaced apart from the first vibration part 11 in the Z'-direction in FIG. 13, which is the direction in which the first vibration part 11 and the second vibration part 17 are arranged in line. Therefore, the resonance of each of the first vibration part 11 and the second vibration part 17 can be more stabilized.

3. Third Embodiment

A vibration element 1b according to a third embodiment will now be described with reference to FIGS. 15 and 16.

Figure 15:
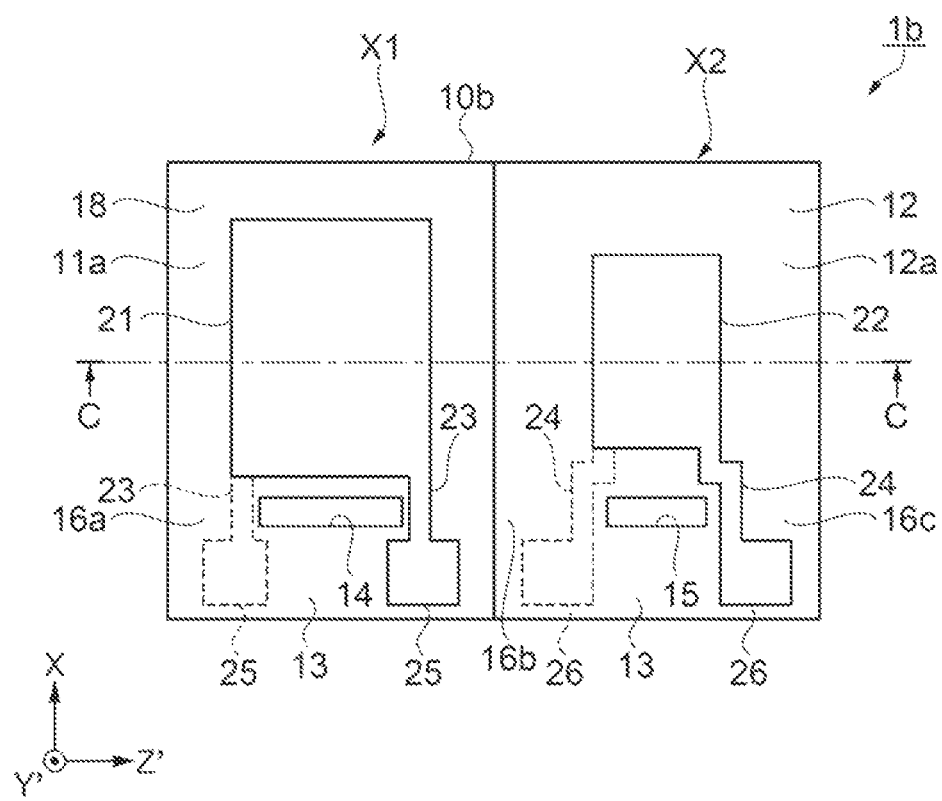
FIG. 15 is a plan view showing a schematic configuration of a vibration element according to a third embodiment.

FIG. 15 is a plan view showing a schematic configuration of the vibration element 1b according to the third embodiment. FIG. 16 is a cross-sectional view taken along C-C in FIG. 15.

The vibration element 1b according to this embodiment is similar to the vibration element 1 according to the first embodiment except that the shape of a first vibration part 18 is different from the shape of the first vibration part of the vibration element 1 according to the first embodiment. The difference from the first embodiment will now be described mainly. Similar matters will not be described further.

Figure 16:
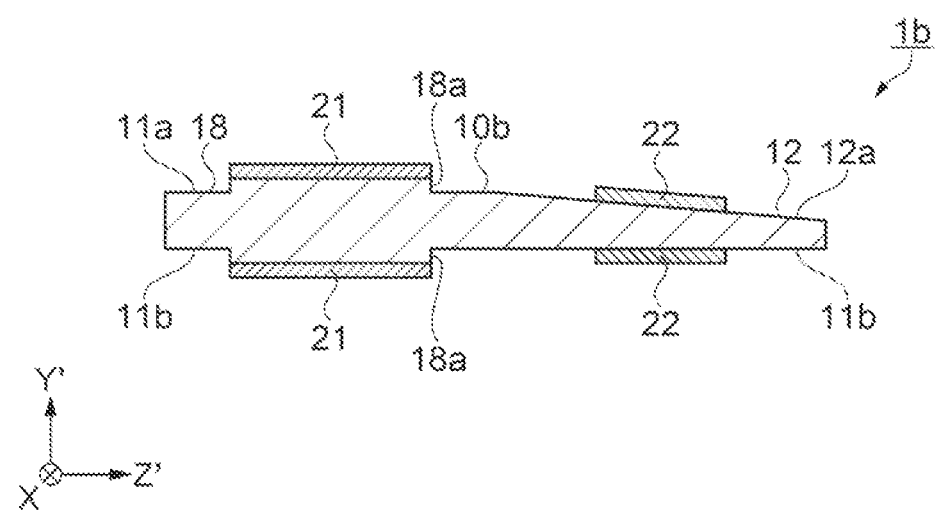
FIG. 16 is a cross-sectional view taken along C-C in FIG. 15.

In the vibration element 1b, two protrusions 18a are formed at the first vibration part 18 of a quartz crystal substrate 10b, and the first excitation electrodes 21 are arranged on the protrusions 18a, as shown in FIGS. 15 and 16. One protrusion 18a protrudes upward from the first main surface 11a of the first vibration part 18, as viewed in a cross-sectional view. The other protrusion 18a protrudes downward from the second main surface 11b, as viewed in a cross-sectional view. The protrusion 18a may be formed on one of the first main surface 11a and the second main surface 11b.

Such a configuration enables the resonance energy of the first vibration part 18 to be trapped in the protrusion 18a. Therefore, resonance leakage from the first vibration part 18 to the fixing part 13 can be reduced and the resonance of the first vibration part 18 can be stabilized.

4. Fourth Embodiment

A vibration element 1c according to a fourth embodiment will now be described with reference to FIGS. 17 and 18.

Figure 17:
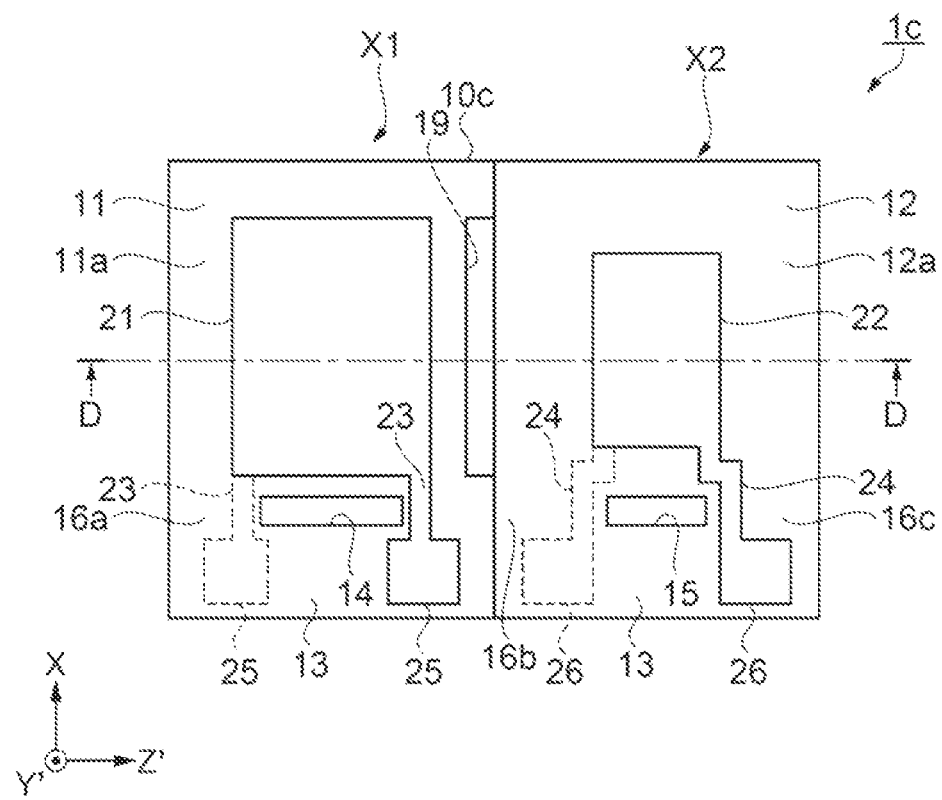
FIG. 17 is a plan view showing a schematic configuration of a vibration element according to a fourth embodiment.

FIG. 17 is a plan view showing a schematic configuration of the vibration element 1c according to the fourth embodiment. FIG. 18 is a cross-sectional view taken along D-D in FIG. 17.

The vibration element 1c according to this embodiment is similar to the vibration element 1 according to the first embodiment except that the shape of a quartz crystal substrate 10c is different from the shape of the quartz crystal substrate of the vibration element 1 according to the first embodiment. The difference from the first embodiment will now be described mainly. Similar matters will not be described further.

Figure 18:
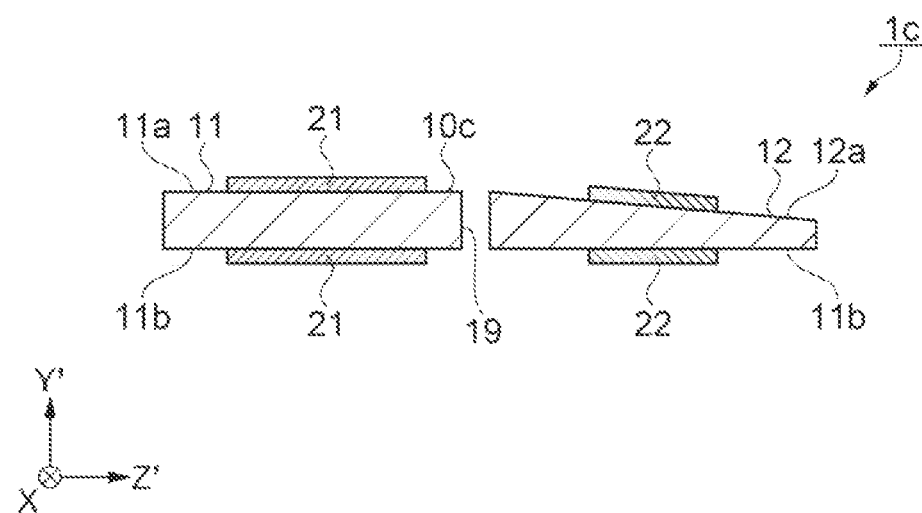
FIG. 18 is a cross-sectional view taken along D-D in FIG. 17.

In the vibration element 1c, a through-hole 19 having a longitudinal direction in the X-direction is provided between the first vibration part 11 and the second vibration part 12 of the quartz crystal substrate 10c, as shown in FIGS. 17 and 18.

Such a configuration can reduce leakage of the resonance of each of the first vibration part 11 and the second vibration part 12 to the first vibration part 11 and the second vibration part 12. Therefore, the resonance of each of the first vibration part 11 and the second vibration part 12 can be more stabilized.

5. Fifth Embodiment

A vibration element 1d according to a fifth embodiment will now be described with reference to FIGS. 19 and 20.

Figure 19:
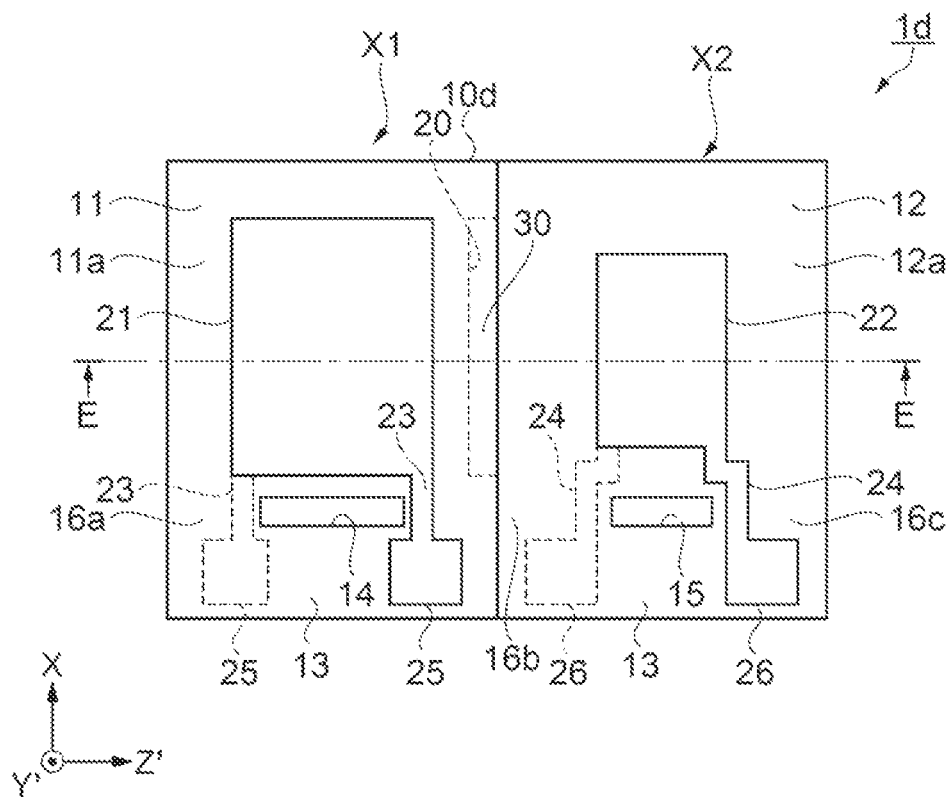
FIG. 19 is a plan view showing a schematic configuration of a vibration element according to a fifth embodiment.

FIG. 19 is a plan view showing a schematic configuration of the vibration element 1d according to the fifth embodiment. FIG. 20 is a cross-sectional view taken along E-E in FIG. 19.

The vibration element 1d according to this embodiment is similar to the vibration element 1 according to the first embodiment except that the shape of a quartz crystal substrate 10d is different from the shape of the quartz crystal substrate of the vibration element 1 according to the first embodiment. The difference from the first embodiment will now be described mainly. Similar matters will not be described further.

Figure 20:
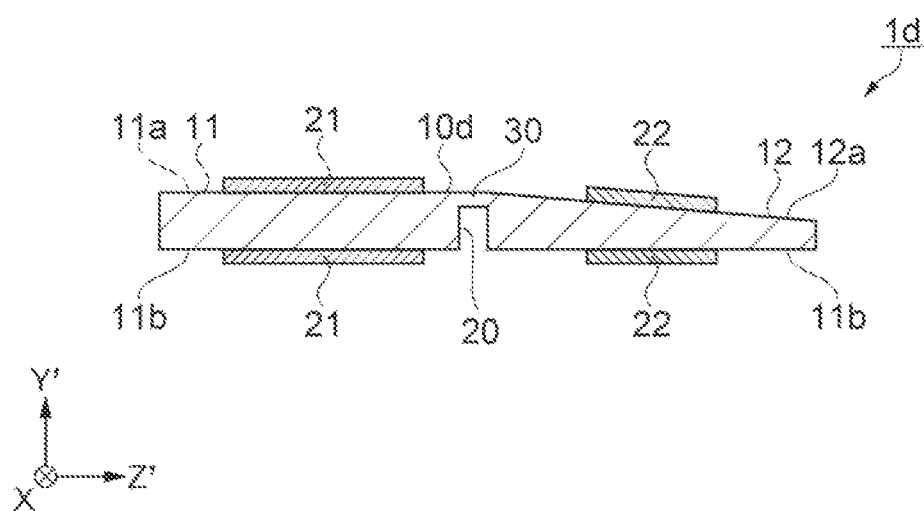
FIG. 20 is a cross-sectional view taken along E-E in FIG. 19.

In the vibration element 1d, a recess 20 having a longitudinal direction in the X-direction and opening downward as viewed in a cross-sectional view is provided between the first vibration part 11 and the second vibration part 12 of the quartz crystal substrate 10d, and therefore the vibration element 1d has a thin part 30, as shown in FIGS. 19 and 20.

Such a configuration can reduce leakage of the resonance of each of the first vibration part 11 and the second vibration part 12 to the first vibration part 11 and the second vibration part 12. Therefore, the resonance of each of the first vibration part 11 and the second vibration part 12 can be more stabilized.

6. Sixth Embodiment

An oscillator 100 having the vibration element 1, 1a, 1b, 1c, 1d according to a sixth embodiment will now be described with reference to FIGS. 21 and 22. In the description below, a configuration employing the vibration element 1 is described as an example.

Figure 21:
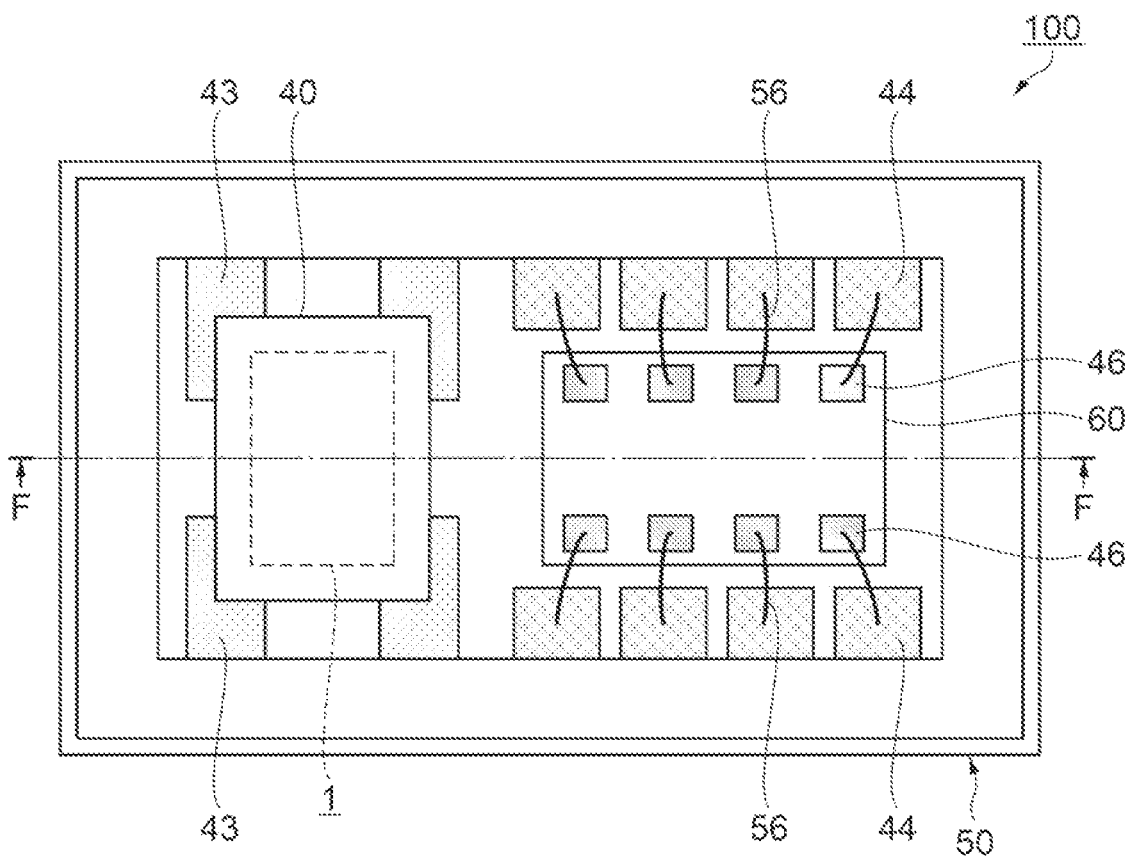
FIG. 21 is a plan view showing a schematic configuration of a vibration element according to a sixth embodiment.

FIG. 21 is a plan view showing a schematic structure of the oscillator 100 according to the sixth embodiment. FIG. 22 is a cross-sectional view taken along F-F in FIG. 21.

As shown in FIG. 21, the oscillator 100 has a vibrator 40 having the vibration element 1 built therein, an IC chip 60 which has oscillation circuits 61, 62 for driving the vibration element 1 and also has a control signal output circuit 63, a package main body 50 accommodating the vibrator 40 and the IC chip 60, and a lid member 57 made of glass, ceramic, or metal or the like.

Figure 22:
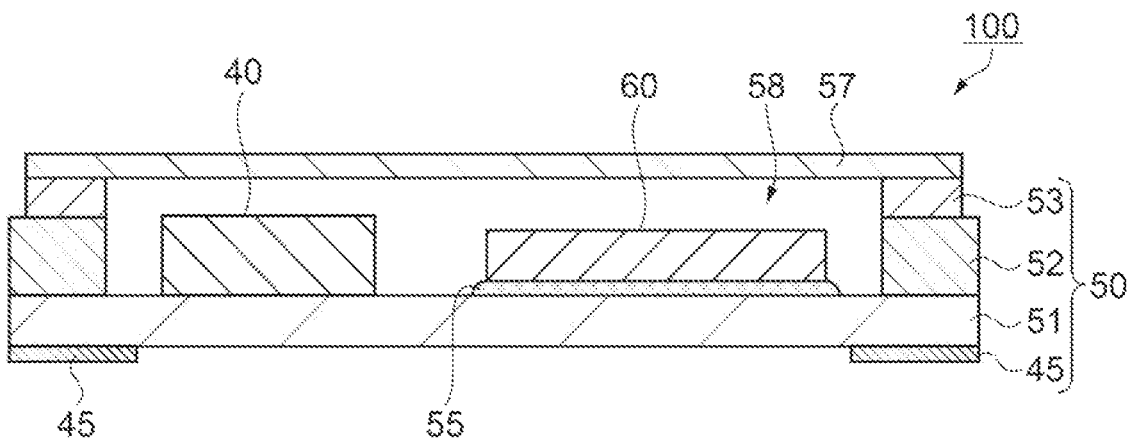
FIG. 22 is a cross-sectional view taken along F-F in FIG. 21.

The package main body 50 is formed of a mounting terminal 45, a first substrate 51, a second substrate 52, and a seal ring 53 stacked on each other, as shown in FIG. 22. The package main body 50 also has a cavity 58 opening upward. As the lid member 57 is bonded via the seal ring 53, the inside of the cavity 58, where the vibrator 40 and the IC chip 60 are accommodated, is airtightly sealed, having a reduced-pressure atmosphere or an inert gas atmosphere such as nitrogen.

The mounting terminal 45 is provided in a plural number at an outer bottom surface of the first substrate 51. The mounting terminal 45 is electrically coupled to a coupling electrode 43 and a coupling terminal 44 provided above the first substrate 51, via a through electrode or interlayer wiring, not illustrated.

Inside the cavity 58 of the package main body 50, the vibrator 40 and the IC chip 60 are accommodated. The vibrator 40 is fixed to the coupling electrode 43 provided above the first substrate 51, via a solder or electrically conductive adhesive. The IC chip 60 is fixed above the first substrate 51 via a bonding member 55 such as an adhesive. Also, a plurality of coupling terminals 44 are provided in the cavity 58. The coupling terminal 44 is electrically coupled to a coupling terminal 46 provided above the IC chip 60, via a bonding wire 56.

The IC chip 60 has a first oscillation circuit 61 oscillating the first vibration element X1 and outputting a first oscillation signal, a second oscillation circuit 62 oscillating the second vibration element X2 and outputting a second oscillation signal, and a control signal output circuit 63 which outputs a control signal for controlling the oscillation frequency of the first oscillation signal, based on the second oscillation signal.

The circuit configuration of the oscillator 100 will now be described with reference to FIG. 23.

Figure 23:
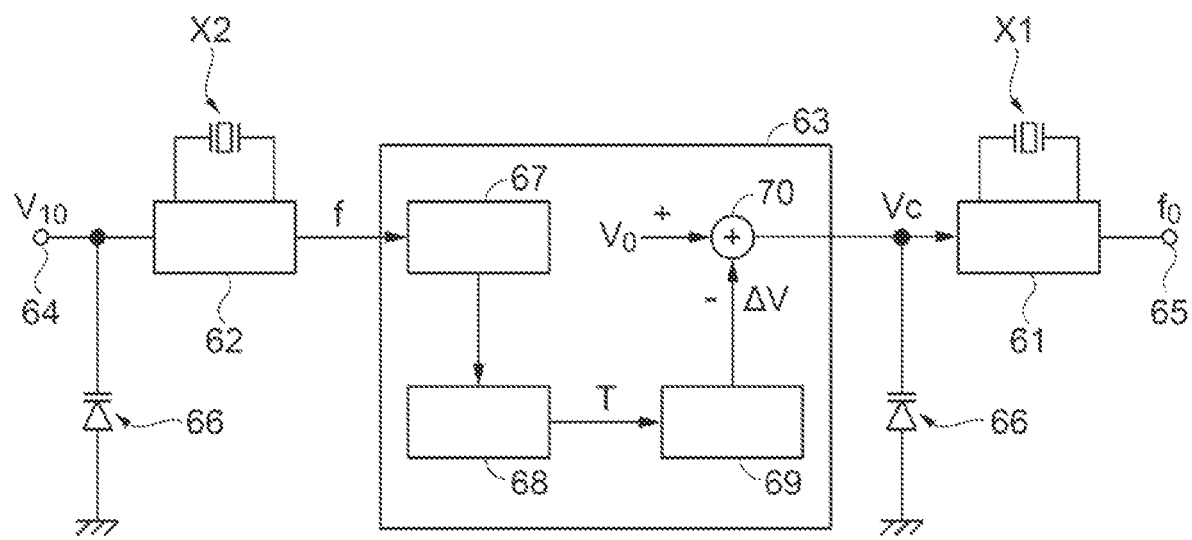
FIG. 23 is a block diagram showing a circuit configuration of an oscillator.

FIG. 23 is a block diagram showing the circuit configuration of the oscillator 100. In the description below, TCXO is employed as an example of the oscillator 100.

The oscillator 100 is a circuit for outputting a signal of a set frequency $f_0$ to outside and is configured to be able to output the set frequency $f_0$ regardless of temperature change outside the oscillator 100 or restraining the influence of external temperature change. The set frequency $f_0$ is an output frequency acquired when a reference voltage $V_{10}$ is applied to the first oscillation circuit 61 at a reference temperature $T_0$, for example, 25° C.

The first oscillation circuit 61 is electrically coupled to the pair of first excitation electrodes 21 of the first vibration element X1 via the terminals 25. Similarly, the second oscillation circuit 62 for temperature detection is electrically coupled to the pair of second excitation electrodes 22 of the second vibration element X2 via the terminals 26. Between the first oscillation circuit 61 and the second oscillation circuit 62, the control signal output circuit 63 for estimating the temperature of the first vibration element X1, based on an oscillation frequency f as a second oscillation signal for temperature compensation outputted from the second oscillation circuit 62, and computing a control voltage $V_c$ ($V_c=V_0-\Delta V$) with which the first oscillation circuit 61 acquires the set frequency $f_0$ as a first oscillation signal at this temperature, is provided. The reference voltage $V_{10}$ is inputted to the second oscillation circuit 62 from an input terminal 64. The set frequency $f_0$ is outputted from an output terminal 65. The control voltage $V_c$ and the reference voltage $V_{10}$ stabilized by a varicap diode 66 are inputted to the first oscillation circuit 61 and the second oscillation circuit 62, respectively.

Specifically, the control signal output circuit 63 has a frequency detection unit 67 formed of, for example, a frequency counter for measuring the oscillation frequency f from a frequency signal inputted from the second oscillation circuit 62, a temperature estimation unit 68 estimating the temperature T based on the oscillation frequency f measured by the frequency detection unit 67, a compensated voltage computation unit 69 for computing a compensated voltage $\Delta V$ based on the temperature T estimated by the temperature estimation unit 68, and an addition unit for outputting the control voltage $V_c$ resulting from subtracting the compensated voltage $\Delta V$ computed by the compensated voltage computation unit 69 from a reference voltage $V_0$, to the first oscillation circuit 61. In the temperature estimation unit 68, the frequency-temperature characteristics of the second oscillation circuit 62 expressed by the following equation (1), for example, a tertiary function, is stored. The temperature estimation unit 68 finds the temperature of the first vibration element X1, based on the foregoing temperature characteristics and the oscillation frequency f of the second oscillation circuit 62.

$$f = f_{10}\{1 + \alpha_2(T-T_{10})^3 + \beta_2(T-T_{10}) + \gamma_2\} \quad (1)$$

The compensated voltage computation unit 69 has, for example, a tertiary function generator corresponding to the temperature characteristics of the first oscillation circuit 61, and is configured to find the compensated voltage $\Delta V$, based on the following equations (2) to (4) and the temperature T.

$$\Delta V = V_0(\Delta f/f_0) \quad (2)$$

$$\Delta f/f_0 = \alpha_1(T-T_0)^3 + \beta_1(T-T_{10}) + \gamma_1 \quad (3)$$

$$\Delta V = V_0\{\alpha_1(T-T_0)^3 + \beta_1(T-T_0) + \gamma_1\} \quad (4)$$

In the equations, $\alpha_1$, $\beta_1$, $\gamma_1$ and $\alpha_2$, $\beta_2$, $\gamma_2$ are constants specific to the first oscillation circuit 61 and the second oscillation circuit 62, respectively, and are found by measuring the output frequency with the temperature and reference voltage changed in various ways. $\Delta f = f - f_0$ holds, and $f_{10}$ is an output frequency acquired when the reference voltage $V_{10}$ is applied to the second oscillation circuit 62 at the reference temperature $T_{10}$.

In the oscillator 100, when the reference voltage $V_{10}$ is inputted to the input terminal 64, the second oscillation circuit 62 oscillates in thickness-shear resonance of the fundamental mode at the oscillation frequency f found by the foregoing equation (1), based on the temperature T of the second vibration element X2. The oscillation frequency f is inputted to the temperature estimation unit 68 via the frequency detection unit 67. The temperature estimation unit 68 estimates the temperature T of the first vibration element X1. The compensated voltage computation unit 69 computes the compensated voltage $\Delta V$ based on the temperature T acquired by the temperature estimation unit 68. The control voltage $V_c$ is applied to the first oscillation circuit 61 via the addition unit 70. The first oscillation circuit 61 resonates in thickness-shear resonance at the oscillation frequency f corresponding to the temperature T of the first vibration element X1 and the control voltage $V_c$, that is, the set frequency $f_0$. That is, in the first oscillation circuit 61 at the temperature T, the oscillation frequency f is to shift from the set frequency $f_0$ along the tertiary function of the frequency-temperature characteristics of the first oscillation circuit 61 by the difference $(T-T_0)$ between the temperature T and the reference temperature $T_0$. However, since the control voltage $V_c$ with which the set frequency $f_0$ is acquired is applied to the first oscillation circuit 61, that is, since the control voltage $V_c$ lower or higher than the reference voltage $V_0$ by an amount corresponding to the difference is applied, the set frequency $f_0$ is acquired with the difference being offset.

In the oscillator 100 according to this embodiment, a control signal is outputted which controls the set frequency $f_0$ as the first oscillation signal, based on the oscillation frequency f as the second oscillation signal oscillated by the second vibration element X2 having frequency-temperature characteristics including a greater amount of frequency change $\Delta f/f$ to the temperature T than the first vibration element X1. Therefore, the set frequency $f_0$ can be accurately temperature-compensated. The oscillator 100 achieving high accuracy can be provided.

The contents derived from the embodiments will now be described.

A vibration element includes: a quartz crystal substrate having a first vibration part and a second vibration part; a pair of first excitation electrodes formed at two main surfaces of the quartz crystal substrate, at the first vibration part; and a pair of second excitation electrodes formed in such a way as to sandwich the second vibration part in a direction of thickness of the quartz crystal substrate, at the second vibration part. At least one second excitation electrode of the pair of second excitation electrodes is formed at an inclined surface inclined to the two main surfaces.

In this configuration, the second vibration part has the inclined surface inclined to the main surfaces. Therefore, by having the second excitation electrode formed thereat, the second vibration part can have different frequency-temperature characteristics from the first vibration part. One of the first vibration part and the second vibration part is set to have stable frequency-temperature characteristics as a vibration part for oscillation signal output, and the other vibration part is used as a vibration part for temperature detection having frequency-temperature characteristics including a greater amount of frequency change to temperature change than the vibration part for oscillation signal output. Thus, the temperature of the vibration part for oscillation signal output can be detected accurately.

In the vibration element, the two main surfaces and the inclined surface may have different cutting angles from each other.

In this configuration, the main surfaces and the inclined surface have different cutting angles from each other. Therefore, the frequency-temperature characteristics of the second vibration part having the inclined surface with a different cutting angle from the main surfaces can be made different from the frequency-temperature characteristics of the first vibration part.

In the vibration element, the first vibration part and the second vibration part may have different frequency-temperature characteristics from each other.

In this configuration, the first vibration part ad the second vibration part have different frequency-temperature characteristics from each other. Therefore, the vibration part having frequency-temperature characteristics including a greater amount of frequency change to temperature change is used for temperature detection, and the accuracy of temperature detection can be thus improved.

In the vibration element, the frequency-temperature characteristics of the second vibration part may include a greater amount of frequency change than the frequency-temperature characteristics of the first vibration part.

In this configuration, the frequency-temperature characteristics of the second vibration part include a greater amount of frequency change than the frequency-temperature characteristics of the first vibration part. Therefore, when the second vibration part is used for temperature detection, the resolution of temperature change to frequency change increases and the temperature of the first vibration part can be detected accurately.

In the vibration element, the inclined surface may be inclined in such a way that the second vibration part has a thickness reduced as it goes away from the first vibration part.

In this configuration, the inclined surface is inclined in such a way that the second vibration part has a thickness reduced as it goes away from the first vibration part. Therefore, the second vibration part has a different cutting angle from the first vibration part and thus can have different frequency-temperature characteristics from the first vibration part.

In the vibration element, the inclined surface may be inclined in such a way that the second vibration part has a thickness reduced as it goes toward the first vibration part.

In this configuration, the inclined surface is inclined in such a way that the second vibration part has a thickness reduced as it goes toward the first vibration part. Therefore, the second vibration part has a different cutting angle from the first vibration part and thus can have different frequency-temperature characteristics from the first vibration part. Also, a substantial resonance area of the second vibration part can be spaced apart from the first vibration part in the direction in which the first vibration part and the second vibration part are arranged in line. Therefore, the resonance of each of the first vibration part and the second vibration part can be more stabilized.

In the vibration element, the first vibration part may have a protrusion formed at least at one of the two main surfaces.

In this configuration, as the protrusion is formed at a main surface of the first vibration part, the resonance energy of the first vibration part can be trapped in the protrusion. Therefore, resonance leakage from the first vibration part to the fixing part can be reduced and the resonance of the first vibration part can be stabilized.

The vibration element may have a fixing part fixing the vibration element to a package and may have at least one of a through-hole and a narrow part between the first vibration part and the second vibration part, and the fixing part.

In this configuration, the through-hole and the narrow part are provided between the first vibration part and the second vibration part, and the fixing part. Therefore, resonance leakage from the first vibration part and the second vibration part to the fixing part can be reduced and transmission of a stress from the fixing part to the first vibration part and the second vibration part due to loading into the package can be reduced.

The vibration element may have at least one of a through-hole and a thin part between the first vibration part and the second vibration part.

In this configuration, the through-hole and the thin part are provided between the first vibration part and the second vibration part. Therefore, leakage of the resonance of each of the first vibration part and the second vibration part to the first vibration part and the second vibration part can be reduced.

An oscillator includes: the foregoing vibration element; a first oscillation circuit electrically coupled to the first excitation electrodes and outputting a first oscillation signal; a second oscillation circuit electrically coupled to the second excitation electrodes and outputting a second oscillation signal; and a control signal output circuit outputting a control signal controlling an oscillation frequency of the first oscillation signal, based on the second oscillation signal.

In this configuration, a control signal is outputted which controls the oscillation frequency of the first oscillation signal, based on the second oscillation signal oscillated by the second vibration part having frequency-temperature characteristics including a greater amount of frequency change to the temperature than the first vibration part. Therefore, the first oscillation signal can be accurately temperature-compensated. The oscillator achieving high accuracy can be provided.

What is claimed is:

1. A vibration element comprising:
   a quartz crystal substrate having:
   a rectangular shape in a plan view;
   a first surface;
   an inclined surface extending from the first surface at an incline relative to the first surface;
   a second surface facing oppositely away from the first surface, and that disposed from a back side of the first surface to a back side of the inclined surface;
   a first vibration part including the first surface; and
   a second vibration part including the inclined surface and being adjacent to the first vibration part;
   a pair of first excitation electrodes respectively formed on the first and second surfaces of the quartz crystal substrate, at the first vibration part, so as to overlap in plan view; and
   a pair of second excitation electrodes respectively formed on the inclined surface and the second surface of the quartz crystal substrate, at the second vibration part, so as to overlap in plan view.

2. The vibration element according to claim 1, wherein the first surface and the inclined surface have different cutting angles from each other.

3. The vibration element according to claim 1, wherein the first vibration part and the second vibration part have different frequency-temperature characteristics from each other.

4. The vibration element according to claim 3, wherein the frequency-temperature characteristics of the second vibration part include a greater amount of frequency change than the frequency-temperature characteristics of the first vibration part.

5. The vibration element according to claim 1, wherein the inclined surface is inclined in such a way that the second vibration part has a thickness reduced as it goes away from the first vibration part.

6. The vibration element according to claim 1, wherein the inclined surface is inclined in such a way that the second vibration part has a thickness reduced as it goes toward the first vibration part.

7. The vibration element according to claim 1, wherein the first vibration part has a protrusion formed at least at one of the first and second surfaces.

8. The vibration element according to claim 1, further comprising:
   a fixing part fixing the vibration element to a package, and
   at least one of a through-hole and a narrow part between the first vibration part and the second vibration part, and the fixing part.

9. The vibration element according to claim 1, further comprising:
   at least one of a through-hole and a thin part between the first vibration part and the second vibration part.

10. An oscillator comprising:
    the vibration element according to claim 1;
    a first oscillation circuit electrically coupled to the first excitation electrodes and outputting a first oscillation signal;
    a second oscillation circuit electrically coupled to the second excitation electrodes and outputting a second oscillation signal; and a control signal output circuit outputting a control signal controlling an oscillation frequency of the first oscillation signal, based on the second oscillation signal.

* * * * *